(12) United States Patent
Nakai et al.

(10) Patent No.: US 12,384,874 B2
(45) Date of Patent: Aug. 12, 2025

(54) CURING CATALYST, RESIN COMPOSITION, SEALING MATERIAL, ADHESIVE AND CURED PRODUCT

(71) Applicant: NAMICS CORPORATION, Niigata (JP)

(72) Inventors: Yuya Nakai, Niigata (JP); Takashi Yamaguchi, Niigata (JP)

(73) Assignee: NAMICS CORPORATION, Niigata (JP)

( * ) Notice: Subject to any disclaimer, the term of this patent is extended or adjusted under 35 U.S.C. 154(b) by 531 days.

(21) Appl. No.: 17/802,784

(22) PCT Filed: Apr. 24, 2020

(86) PCT No.: PCT/JP2020/017853
§ 371 (c)(1),
(2) Date: Aug. 26, 2022

(87) PCT Pub. No.: WO2021/199450
PCT Pub. Date: Oct. 7, 2021

(65) Prior Publication Data
US 2023/0097646 A1  Mar. 30, 2023

(30) Foreign Application Priority Data
Mar. 31, 2020  (JP) ................ 2020-064472

(51) Int. Cl.
*C08G 59/40* (2006.01)
*C08L 63/00* (2006.01)
*C09J 163/00* (2006.01)

(52) U.S. Cl.
CPC .......... *C08G 59/4014* (2013.01); *C08L 63/00* (2013.01); *C09J 163/00* (2013.01)

(58) Field of Classification Search
CPC ............ C08G 59/4014; C08G 59/4215; C08G 59/686; C08G 59/42; C08G 59/44; C08G 59/621; H01L 23/293
See application file for complete search history.

(56) References Cited

U.S. PATENT DOCUMENTS 4,542,202 A  9/1985  Takeuchi et al.
5,138,018 A  8/1992  Tashiro et al.
(Continued)

FOREIGN PATENT DOCUMENTS

CN  106687497 A  5/2017
JP  59-53526 A  3/1984
(Continued)

OTHER PUBLICATIONS

International Search Report (ISR) dated Jul. 14, 2020 filed in PCT/JP2020/017853.

*Primary Examiner* — Ling Siu Choi
*Assistant Examiner* — Olga Lucia Donahue
(74) *Attorney, Agent, or Firm* — RANKIN, HILL & CLARK LLP

(57) ABSTRACT

An object of the present invention is to provide a curing catalyst, a resin composition, a sealing material, an adhesive agent, and a cured product, which have good characteristics. A curing catalyst for epoxy resin, which contains an epoxy imidazole adduct having structural formula (I) below, is prepared. Furthermore, a resin composition containing the curing catalyst, a sealing material or an adhesive agent each containing the resin composition, and a cured product obtained by curing the resin composition are prepared. (In the formula, $R^1$ is a group selected from hydrogen, phenyl, and C1-C17 alkyls, and $R^2$ and $R^3$ are each independently a group selected from hydrogen and C1-C6 alkyls.)

(Continued)

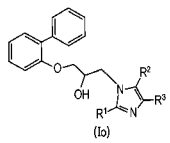

(Io)

(Im)

(Ip)

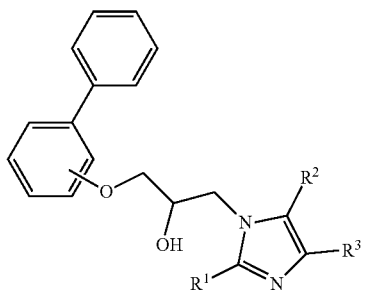

(I)

11 Claims, 2 Drawing Sheets

(56) References Cited

U.S. PATENT DOCUMENTS

| | | |
|---|---|---|
| 10,266,641 B2 | 4/2019 | Takaiwa et al. |
| 2013/0267663 A1 | 10/2013 | Sato |
| 2017/0291985 A1 | 10/2017 | Takaiwa et al. |

FOREIGN PATENT DOCUMENTS

| | | |
|---|---|---|
| JP | 3-177418 A | 8/1991 |
| JP | 11-100546 A | 4/1999 |
| JP | 2000-80146 A | 3/2000 |
| JP | 2011-195767 A | 10/2011 |
| JP | 2013-189577 A | 9/2013 |
| JP | 2017-2246 A | 1/2017 |
| JP | 2017-155127 A | 9/2017 |

(Io)

(Im)

(Ip)

COMPOUND 1

COMPOUND 2

COMPOUND 3

COMPOUND 4

COMPOUND 5

COMPOUND 6

CURING CATALYST, RESIN COMPOSITION, SEALING MATERIAL, ADHESIVE AND CURED PRODUCT

TECHNICAL FIELD

The present invention relates to a curing catalyst, a resin composition, a sealing material, an adhesive agent, and a cured product.

BACKGROUND ART

A one-component epoxy resin-based adhesive agent contains a base resin and a curing catalyst. A curing catalyst is considered a material that most influences the pot life and curing condition of an adhesive agent. Currently, various curing catalysts used in a one-component epoxy resin-based adhesive agent are commercially available. The mainstream is of the type that thermosetting resin or thermoplastic resin is modified with a functional group such as amine (JP-A-59-053526; JP-A-3-177418) and of the type that an amine-based curing catalyst is covered with a polymer body shell (JP-A-2000-080146).

SUMMARY OF INVENTION

Problems to be Solved by Invention

An object of the present invention is to provide a curing catalyst, a resin composition, a sealing material, an adhesive agent, and a cured product, which have good characteristics.

Solution to Problems

An aspect of the present invention is a curing catalyst for epoxy resin, which contains an epoxy imidazole adduct having structural formula (I) below.

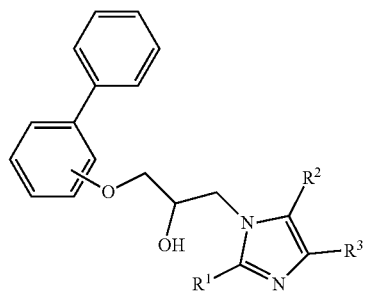
(I)

(In the formula, $R^1$ is a group selected from hydrogen, phenyl, and C1-C17 alkyls, and $R^2$ and $R^3$ are each independently a group selected from hydrogen and C1-C6 alkyls.)

An epoxy imidazole adduct having structural formula (Io) or (Im) below may be contained.

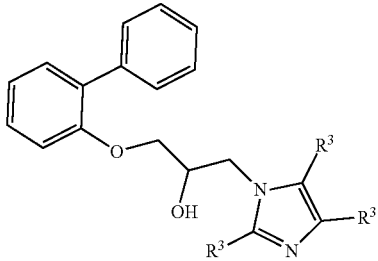
(Io)

(In the formula, $R^1$ is a group selected from hydrogen, phenyl, and C1-C17 alkyls, and $R^2$ and $R^3$ are each independently a group selected from hydrogen and C1-C6 alkyls.)

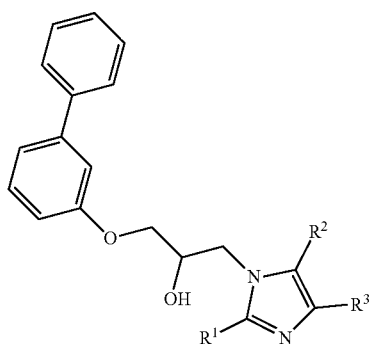
(Im)

(In the formula, $R^1$ is a group selected from hydrogen, phenyl, and C1-C17 alkyls, and $R^2$ and R; are each independently a group selected from hydrogen and C1-C6 alkyls.)

$R^1$ may be a group selected from the group consisting of hydrogen and C1-C6 alkyls, or $R^1$ may be a group selected from the group consisting of C8-C17 alkyls. The epoxy imidazole adduct may be selected from the group consisting of compounds 1 to 4 below.

compound 1

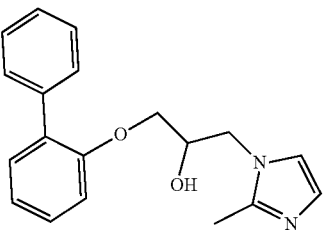

compound 2

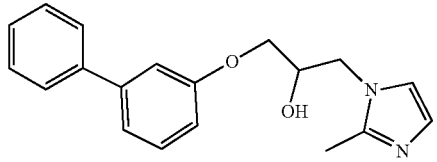

compound 3

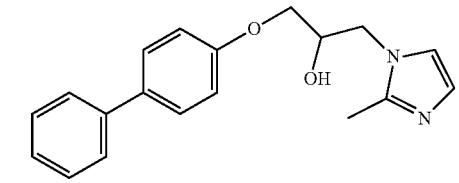

compound 4

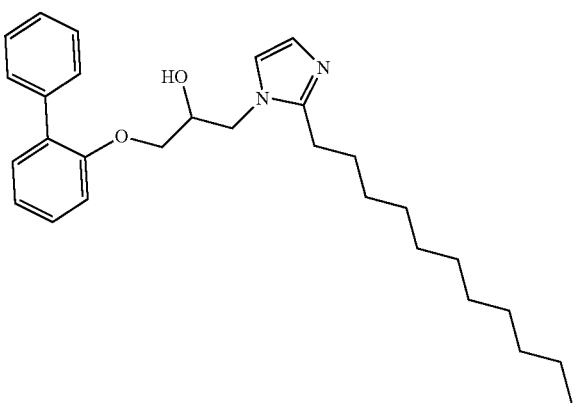

Another aspect of the present invention is a resin composition that contains the above-described curing catalyst and an epoxy resin. A curing agent for the epoxy resin may be further contained. The curing agent may be an acid anhydride-based or phenol-based curing agent.

Still another aspect of the present invention is a sealing material or an adhesive agent each containing the above-described resin composition.

Further still another aspect of the present invention is a cured product of one of the above-described resin compositions.

CROSS-REFERENCE TO RELATED DOCUMENTS

The present application claims the right of priority on the basis of Japanese Patent Application No. 2020-064472 filed Mar. 31, 2020. The basic application is incorporated herein by reference.

DESCRIPTION OF EMBODIMENTS

An object, characteristic, advantage, and idea of the present invention are apparent to those skilled in the art by the description of the present specification, and the present invention can be easily reproduced by those skilled in the art based on the description of the present specification. The below-described embodiments, specific examples, and others of the present invention illustrate preferred aspects of the present invention for exemplification and explanation, and the present invention is not limited thereto. It is apparent to those skilled in the art that various changes and modifications can be made based on the description of the present specification within the purpose and scope of the present invention disclosed herein.

==Curing Catalyst==

<Structure of Epoxy Imidazole Adduct>

A curing catalyst according to the present embodiment contains an epoxy imidazole adduct having structural formula (I) below. As described herein, the curing catalyst refers to a catalyst that has the function of promoting initiation and/or progress of self-polymerization of a base resin or polymerization of a base resin and a curing agent.

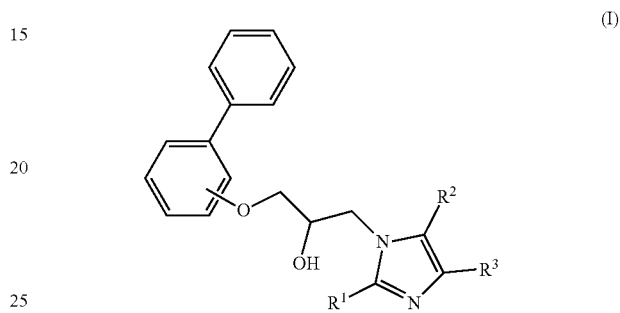

(I)

Figure 1:
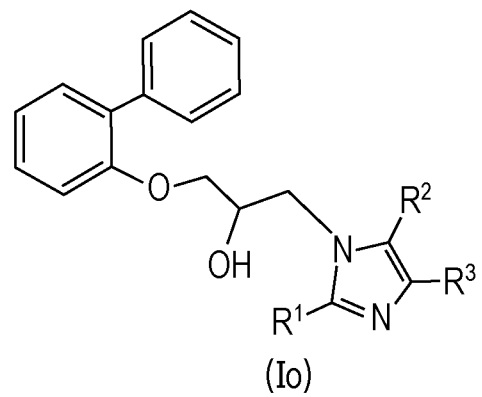
FIG. 1 is a diagram illustrating structural formulae of compound (Io), compound (Im), and compound (Ip) of the present disclosure.
Figure 1:
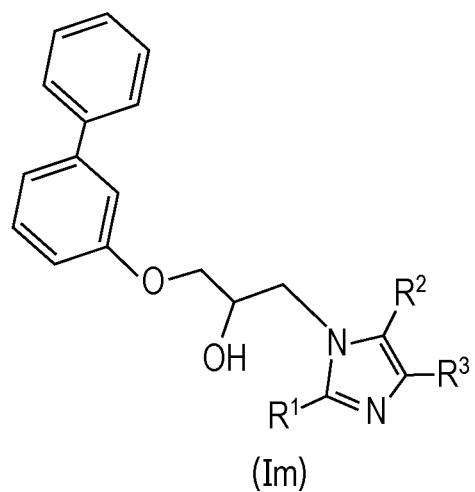
Figure 1:
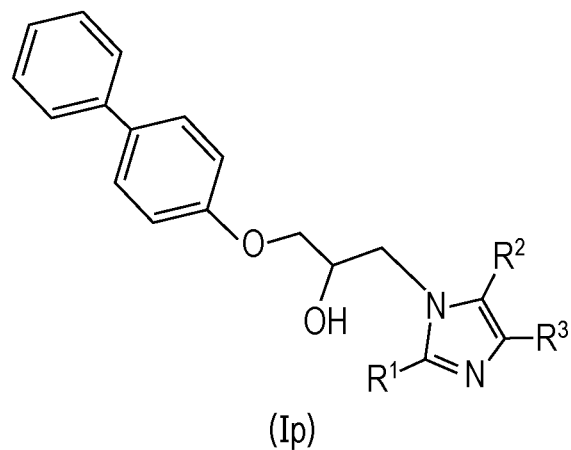

(In the formula, $R^1$ is a group selected from hydrogen, phenyl, and C1-C17 alkyls, and $R^2$ and $R^3$ are each independently a group selected from hydrogen and C1-C6 alkyls.) $R^1$ may be a group selected from phenyl and C1-C12 alkyls. The structure of an alkyl group of $R^2$ and $R^3$ may be linear, branched, or cyclic. It is noted that compound (I) includes compound (Io), compound (Im), and compound (Ip) illustrated in FIG. 1.

In an aspect, $R^1$ is preferably a group selected from C8-C17 alkyls, particularly from C8-C12 alkyls, because the reaction peak top temperature in curing of an epoxy resin composition can be shifted to the lower temperature side. In the measurement methods of later-described examples, the reaction peak top temperature is preferably 180° C. or lower, more preferably 150° C. or lower, and further preferably 130° C. or lower. Also, in another aspect, $R^1$ is preferably a group selected from hydrogen and C1-C6 alkyls, particularly from hydrogen and C1-C3 alkyls, from the viewpoint of pot life. In the measurement methods of later-described examples, the pot life is preferably 0.7 to 5.0, more preferably 0.7 to 3.0, and further preferably 0.7 to 2.0.

The above-described epoxy amine adduct is a compound obtained by reaction between amine and a biphenyl compound having one epoxy group.

The biphenyl compound having one epoxy group may have another substituent group. Examples thereof include a chained alkyl group (for example, a methyl group, an ethyl group, an n-propyl group, an isopropyl group, an n-butyl group, a sec-butyl group, a tert-butyl group, an isobutyl group, an n-pentyl group, an isopentyl group, a neopentyl group, a tert-pentyl group, an n-hexyl group, an isohexyl group, an n-heptyl group, and an n-octyl group), a cycloalkyl group (for example, a cyclopropyl group, a cyclobutyl group, a cyclopentyl group, a cyclohexyl group, a cycloheptyl group, and a cyclooctyl group), an allyl group, an aryl group (for example, a phenyl group and a benzyl group), an acyl group, an acyloxy group, an alkoxy group, a halogen group, an alkyl halide group, a sulfone group, a nitro group, and a carboxyl group. The one epoxy group substituting on the biphenyl may substitute at any position.

The imidazole compound to be adducted is not particularly limited, but preferably imidazole, 2-methyl imidazole, 2-undecyl imidazole, 2-heptadecyl imidazole, 2-phenyl imidazole, or 2-ethyl-4-methyl imidazole. From the viewpoint of striking a balance between curing properties and pot life, 2-methyl imidazole or 2-undecyl imidazole is more preferable. Examples of a commercially available imidazole compound to be adducted include 2MZ-H, C11Z, C17Z, 2PZ, and 2E4MZ manufactured by Shikoku Chemicals Corporation.

When 2-methyl imidazole is adducted, the one epoxy group substituting on the biphenyl is preferably at the ortho or meta position, and more preferably at the ortho position, from the viewpoint of a melting point. At the ortho position, a balance between dispersion of a curing catalyst and curing reaction at 100° C. or higher is best.

<Production Method of Epoxy Imidazole Adduct>

This epoxy imidazole adduct can be produced by, for example, reaction of a methyl imidazole derivative having an imidazole ring that has the same modification as the above-described compound, with 2-{[([1,1'-biphenyl]-2-yl)oxy]methyl}oxirane, 2-{[([1,1'-biphenyl]-3-yl)oxy]methyl}oxirane or 2-{[([1,1'-biphenyl]-4-yl)oxy]methyl}oxirane. However, the production method is not limited thereto. The production can be performed by a method known to those skilled in the art.

A solvent used for synthesis reaction of the epoxy imidazole adduct are not particularly limited. Examples thereof include hydrocarbons such as benzene, toluene, xylene, cyclohexane, hexane, heptane, octane, mineral spirit, and naphtha; chained ethers such as dimethyl ether, diethyl ether, and ethyl methyl ether; cyclic ethers such as tetrahydrofuran and tetrahydropyran; nitriles such as acetonitrile, propionitrile, and butyronitrile; amides such as acetamide, formamide, N,N-dimethylacetamide, and N,N-dimethylformamide; sulfoxides such as dimethyl sulfoxide and diethyl sulfoxide; ketones such as acetone, methyl ethyl ketone (MEK), methyl isobutyl ketone (MIBK), and isophorone; esters such as ethyl acetate, acetic acid-n-butyl, and propylene glycol monomethyl ether acetate; alcohols such as methanol, ethanol, isopropanol, n-butanol, butyl cellosolve, and butyl carbitol; and water. These solvents may be used individually or in combination of two or more.

<Characteristics of Epoxy Imidazole Adduct>

This epoxy imidazole adduct does not have a BPA (bisphenol A) backbone. Therefore, the cured product does not generate BPA which is said to pose a risk to the health of living organisms. Accordingly, this epoxy imidazole adduct has high safety. For example, when the epoxy imidazole adduct disclosed herein is used as a curing catalyst for bisphenol A type epoxy resin, generation of BPA from the cured product can be significantly suppressed compared to when a known bisphenol A type epoxy amine adduct is used. It is considered that this is because the structure of the polymer allows BPA to be generated only from the terminal of the polymerized bisphenol A type epoxy resin.

Also, as illustrated in Examples, when this is used as a curing catalyst for epoxy resin, the pot life is long, and a uniform coating film can be formed. Furthermore, the cured product is unlikely to deteriorate in moisture resistance and has a low water absorption rate. It is considered that the principle of these effects is that low compatibility between a biphenyl backbone contained in the curing catalyst and an epoxy resin at normal temperature lengthens pot life. However, we do not stick to this theory. Also, compatibility between a biphenyl backbone and epoxy resin is high at 100° C. or higher. Therefore, dispersion of the curing catalyst and curing reaction proceed in a balanced manner. Accordingly, the residue of an unreacted curing catalyst decreases, and a uniform coating film can be formed through curing. When an unreacted curing catalyst exists as an aggregate after curing, this aggregate is likely to absorb water and therefore causes the cured product to deteriorate in moisture resistance. When the curing catalyst of the present invention is used, it is considered that an unreacted curing catalyst is unlikely to remain as an aggregate, which can reduce deterioration in moisture resistance.

The melting point of this epoxy imidazole adduct can be calculated, for example, by the following procedure, using a differential scanning calorimeter (DSC 204 F1 Phoenix (registered trademark)) (manufactured by NETZSCH). First, 5 mg of each resin composition is weighed into an aluminum pan, and the aluminum pan is sealed with an aluminum lid. Thereafter, the center of this lid is punched with a needle to prepare a measurement sample. Next, this measurement sample is measured for a heat flow (mW/mg) while increasing in temperature under the conditions of nitrogen atmosphere (100 mL/min), a temperature ranging from 25° C. to 250° C., and a temperature increasing rate of 10° C./min. A temperature at which a peak top is obtained on the graph is calculated by an analysis software (NETZSCH Proteus-Thermal Analysis Version 6.1.0 B). This temperature is called a melting peak temperature herein.

<Curing Catalyst>

The curing catalyst disclosed herein may contain one or a plurality of the above-described epoxy imidazole adducts. Also, at least one curing catalyst other than the above-described epoxy imidazole adducts may be contained.

Other curing catalysts are not particularly limited. Examples thereof include a curing catalyst of the type that thermoplastic resin is modified with a functional group such as amine and a curing catalyst of the type that an amine-based curing agent is covered with a polymer body shell, both being a commercially available curing catalyst used in a one-component epoxy resin-based adhesive agent. However, other curing catalysts are not limited thereto. When the curing catalyst contains a plurality of compounds, the ratio of the above-described epoxy imidazole adduct is, but not particularly limited to, preferably 1 to 100 wt/o to the total amount of the curing catalyst, more preferably 10 to 100 wt %, further preferably 30 to 100 wt %, particularly preferably 50 to 100 wt %, and most preferably 70 to 100 wt %.

==Resin Composition==

The resin composition disclosed herein contains: a curing catalyst containing an epoxy imidazole adduct having structural formula (I); and an epoxy resin.

<Epoxy Resin>

The epoxy resin is not particularly limited and may be either a monofunctional epoxy resin or a multifunctional epoxy resin.

The monofunctional epoxy resin is an epoxy resin having one epoxy group and has been used as a reactive diluent for adjusting the viscosity of an epoxy resin composition. A monofunctional epoxy resin is roughly classified into an aliphatic monofunctional epoxy resin and an aromatic monofunctional epoxy resin. From the viewpoint of volatility, the epoxy equivalent weight in a monofunctional epoxy resin is preferably 180 to 400 g/eq.

Examples of the aromatic monofunctional epoxy resin include, but not limited to, phenyl glycidyl ether, cresyl glycidyl ether, p-s-butylphenyl glycidyl ether, styrene oxide, p-tert-butylphenyl glycidyl ether, o-phenylphenol glycidyl ether, m-phenylphenol glycidyl ether, p-phenylphenol glycidyl ether, and N-glycidyl phthalimide. Among these, p-tert-butylphenyl glycidyl ether and phenyl glycidyl ether are preferable, and p-tert-butylphenyl glycidyl ether is particularly preferable.

Examples of the aliphatic monofunctional epoxy resin include, but not limited to, n-butyl glycidyl ether, 2-ethylhexyl glycidyl ether, α-pinene oxide, allyl glycidyl ether, 1-vinyl-3,4-epoxycyclohexane, 1,2-epoxy-4-(2-methyloxiranyl)-1-methylcyclohexane, 1,3-bis(3-glycidoxypropyl)-1,1,3,3-tetramethyldisiloxane, and neodecanoic acid glycidyl ester.

The multifunctional epoxy resin refers to an epoxy resin having two or more epoxy groups. Therefore, the resin composition of the present disclosure may contain a bifunctional epoxy resin, a trifunctional epoxy resin, a tetrafunctional epoxy resin, or the like. The multifunctional epoxy resin is roughly classified into an aliphatic multifunctional epoxy resin and an aromatic multifunctional epoxy resin.

Examples of the aliphatic multifunctional epoxy resin include, but not limited to, diepoxy resin such as (poly)ethylene glycol diglycidyl ether, (poly)propylene glycol diglycidyl ether, butanediol diglycidyl ether, neopentyl glycol diglycidyl ether, 1,6-hexanediol diglycidyl ether, trimethylolpropane diglycidyl ether, polytetramethylene ether glycol diglycidyl ether, glycerin diglycidyl ether, neopentyl glycol diglycidyl ether, cyclohexane type diglycidyl ether, and dicyclopentadiene type diglycidyl ether; triepoxy resin such as -trimethylolpropane triglycidyl ether and glycerin triglycidyl ether; alicyclic epoxy resin such as vinyl(3,4-cyclohexene)dioxide and 2-(3,4-epoxycyclohexyl)-5,1-spiro-(3,4-epoxycyclohexyl)-m-dioxane; glycidylamine type epoxy resin such as tetraglycidyl bis(aminomethyl)cyclohexane; hydantoin type epoxy resin such as 1,3-diglycidyl-5-methyl-5-ethylhydantoin; and epoxy resin having a silicone backbone such as -1,3-bis(3-glycidoxypropyl)-1,1,3,3-tetramethyldisiloxane.

Of the above-described examples, "cyclohexane type diglycidyl ether" refers to a compound having a structure in which two glycidyl groups are each linked through an ether bond to a divalent saturated hydrocarbon group having one cyclohexane ring as a parent structure. "Dicyclopentadiene type diglycidyl ether" refers to a compound having a structure in which two glycidyl groups are each linked through an ether bond to a divalent saturated hydrocarbon group having a dicyclopentadine backbone as a parent structure. As cyclohexane type diglycidyl ether, cyclohexanedimethanol diglicidyl ether is particularly preferable.

The aromatic multifunctional epoxy resin is a multifunctional epoxy resin having a structure in which an aromatic ring such as a benzene ring is contained. Many of epoxy resins which have been often used, such as bisphenol A type epoxy resin, are of this type. Examples of the aromatic multifunctional epoxy resin include, but not limited to, bisphenol A type epoxy resin; branched multifunctional bisphenol A type epoxy resin such as p-glycidyloxyphenyl dimethyltrisbisphenol A diglycidyl ether; bisphenol F type epoxy resin; novolac type epoxy resin; tetrabromo bisphenol A type epoxy resin; fluorene type epoxy resin; biphenyl aralkyl epoxy resin; diepoxy resin such as 1,4-phenyldimethanol diglycidyl ether; biphenyl type epoxy resin such as 3,3',5,5'-tetramethyl-4,4'-diglycidyloxybiphenyl; glycidylamine type epoxy resin such as diglycidyl aniline, diglycidyl toluidine, triglycidyl-p-aminophenol, and tetraglycidyl-m-xylylenediamine; and naphthalene ring-containing epoxy resin.

As the aromatic multifunctional epoxy resin, bisphenol F type epoxy resin, bisphenol A type epoxy resin, and glycidylamine type epoxy resin are preferable. Especially, those having an epoxy equivalent weight of 90 to 200 g/eq are preferable.

<Curing Agent>

The resin composition of the present disclosure may contain at least one curing agent. As described herein, the curing agent refers to a compound that cures an epoxy resin as a base resin by reacting with an epoxy group to form a cross-linked structure.

Although the curing agent which may be contained in the resin composition of the present disclosure is not particularly limited, it contains a compound having an active group that is reactive with an epoxy group of an epoxy resin. Examples of the curing agent include nitrogen-containing compounds such as amine and a derivative thereof; oxygen-containing compounds such as carboxylic acid-terminated polyester, acid anhydride-based and phenol-based curing agents, bisphenol A and cresol novolac, and phenol-terminated epoxy resin; and thiol compounds.

Although the nitrogen-containing compounds such as amine and a derivative thereof are not particularly limited, examples thereof include aliphatic polyamine such as triethylenetetramine, tetraethylenepentamine, m-xylenediamine, trimethylhexamethylenediamine, and 2-methylpentamethylenediamine; cycloaliphatic polyamine such as isophoronediamine, 1,3-bisaminomethylcyclohexane, bis(4-aminocyclohexyl)methane, norbornenediamine, and 1,2-diaminocyclohexane; piperazine type polyamine such as N-aminoethyl piperazine and 1,4-bis(2-amino-2-methylpropyl)piperazine; and aromatic polyamines such as diethyltoluenediamine, dimethylthiotoluenediamine, 4,4'-diamino-3,3'-diethyldiphenylmethane, bis(methylthio)toluenediamine, diaminodiphenylmethane, m-phenylenediamine, diaminodiphenylsulfone, diethyltoluenediamine, trimethylene bis(4-aminobenzoate), and polytetramethylene oxide-di-p-aminobenzoate. An example of a commercially available product is T-12 (trade name, manufactured by Sanyo Chemical Industries, Ltd.) (amine equivalent weight: 116).

Although the acid anhydride-based curing agent is not particularly limited, examples thereof include methyltetrahydrophthalic acid anhydrides, methylhexahydrophthalic acid anhydrides, alkylated tetrahydrophthalic acid anhydrides, methylhimic acid anhydrides, succinic acid anhydrides substituted with an alkenyl group, and glutaric acid anhydrides. In particular, preferable are 3,4-dimethyl-6-(2-methyl-1-propenyl)-1,2,3,6-tetrahydrophthalic acid anhydrides, 1-isopropyl-4-methyl-bicyclo[2.2.2]octo-5-ene-2,3-dicarboxylic acid anhydrides, norbornane-2,3-dicarboxylic acid anhydrides, methylnorbornane-2,3-dicarboxylic acid anhydrides, hydrogenated methylnadic acid anhydrides, succinic acid anhydrides substituted with an alkenyl group, and diethylglutaric acid anhydrides.

The phenol-based curing agent refers to monomers, oligomers, and polymers in general which have a phenolic hydroxyl group. Examples thereof include phenol novolac resin and an alkylated or allylated product thereof, cresol novolac resin, phenol aralkyl (containing a phenylene or biphenylene backbone) resin, naphthol aralkyl resin, triphenol methane resin, and dicyclopentadiene type phenolic resin. Especially, allyl phenol novolac resin is preferable.

The thiol compound includes a hydrolyzable multifunctional thiol compound and a nonhydrolyzable multifunctional thiol compound.

Examples of the hydrolyzable multifunctional thiol compound include trimethylolpropane tris(3-mercaptopropionate) (manufactured by SC Organic Chemical Co., Ltd.:

TMMP), tris-[(3-mercaptopropionyloxy)-ethyl]-isocyanurate (manufactured by SC Organic Chemical Co., Ltd.: TEMPIC), pentaerythritol tetrakis(3-mercaptopropionate) (manufactured by SC Organic Chemical Co., Ltd.: PEMP), tetraethyleneglycol bis(3-mercaptopropionate) (manufactured by SC Organic Chemical Co., Ltd.: EGMP-4), dipentaerythritol hexakis(3-mercaptopropionate) (manufactured by SC Organic Chemical Co., Ltd.: DPMP), pentaerythritol tetrakis(3-mercaptobutyrate) (manufactured by Showa Denko K.K.: Karenz MT (registered trademark) PE1), and 1,3,5-tris(3-mercaptobutyryloxyethyl)-1,3,5-triazine-2,4,6 (1H,3H,5H)-trione (manufactured by Showa Denko K.K.: Karenz MT (registered trademark) NR1).

Examples of the nonhydrolyzable multifunctional thiol compound include 1,3,4,6-tetrakis(2-mercaptoethyl)glycoluril (trade name: TS-G, manufactured by Shikoku Chemicals Corporation), (1,3,4,6-tetrakis(3-mercaptopropyl)glycoluril (trade name: C3 TS-G, manufactured by Shikoku Chemicals Corporation), 1,3,4,6-tetrakis(mercaptomethyl)glycoluril, 1,3,4,6-tetrakis(mercaptomethyl)-3a-methyl glycoluril, 1,3,4,6-tetrakis(2-mercaptoethyl)-3a-methyl glycoluril, 1,3,4,6-tetrakis(3-mercaptopropyl)-3a-methyl glycoluril, 1,3,4,6-tetrakis(mercaptomethyl)-3a,6a-dimethyl glycoluril, 1,3,4,6-tetrakis(2-mercaptoethyl)-3a, 6a-dimethyl glycoluril, 1,3,4,6-tetrakis(3-mercaptopropyl)-3a,6a-dimethyl glycoluril, 1,3,4,6-tetrakis(mercaptomethyl)-3a,6a-diphenyl glycoluril, 1,3,4,6-tetrakis(2-mercaptoethyl)-3a,6a-diphenyl glycoluril, 1,3,4, 6-tetrakis(3-mercaptopropyl)-3a,6a-diphenyl glycoluril, pentaerythritol tripropanethiol (trade name: PEPT, manufactured by SC Organic Chemical Co., Ltd.), and pentaerythritol tetrapropanethiol.

Also, the nonhydrolyzable multifunctional thiol compound to be used may be a polythiol compound which is trifunctional or more than trifunctional and has two or more sulfide bonds in the molecule. Examples of such a thiol compound include aliphatic polythiol compounds such as 1,2,3-tris(mercaptomethylthio)propane, 1,2,3-tris(2-mercaptoethylthio)propane, 1,2,3-tris(3-mercaptopropylthio) propane, 4-mercaptomethyl-1,8-dimercapto-3,6-dithiaoctane, 5,7-dimercaptomethyl-1,11-dimercapto-3,6,9-trithiaundecane, 4,7-dimercaptomethyl-1,11-dimercapto-3, 6,9-trithiaundecane, 4,8-dimercaptomethyl-1,11-dimercapto-3,6,9-trithiaundecane, tetrakis (mercaptomethylthiomethyl)methane, tetrakis(2-mercaptoethylthiomethyl)methane, tetrakis(3-mercaptopropylthiomethyl)methane, 1,1,3,3-tetrakis (mercaptomethylthio)propane, 1,1,2,2-tetrakis (mercaptomethylthio)ethane, 1,1,5,5-tetrakis (mercaptomethylthio)-3-thiapentane, 1,1,6,6-tetrakis (mercaptomethylthio)-3,4-dithiahexane, 2,2-bis (mercaptomethylthio)ethanethiol, 3-mercaptomethylthio-1, 7-dimercapto-2,6-dithiaheptane, 3,6-bis (mercaptomethylthio)-1,9-dimercapto-2,5,8-trithianonane, 3-mercaptomethylthio-1,6-dimercapto-2,5-dithiahexane, 1,1,9,9-tetrakis(mercaptomethylthio)-5-(3,3-bis(mercaptomethylthio)-1-thiapropyl)3,7-dithianonane, tris(2,2-bis (mercaptomethylthio)ethyl)methane, tris(4,4-bis(mercaptomethylthio)-2-thiabutyl)methane, tetrakis(2,2-bis (mercaptomethylthio)ethyl)methane, tetrakis(4,4-bis (mercaptomethylthio)-2-thiabutyl)methane, 3,5,9,11-tetrakis(mercaptomethylthio)-1,13-dimercapto-2,6,8,12-tetrathiatridecane, 3,5,9,11,15,17-hexakis (mercaptomethylthio)-1,19-dimercapto-2,6,8,12,14,18-hexathianonadecane, 9-(2,2-bis(mercaptomethylthio)ethyl)-3,5,13,15-tetrakis(mercaptomethylthio)-1,17-dimercapto-2, 6,8,10,12,16-hexathiaheptadecane, 3,4,8,9-tetrakis (mercaptomethylthio)-1,11-dimercapto-2,5,7,10-tetrathiaundecane, 3,4,8,9,13,14-hexakis (mercaptomethylthio)-1,16-dimercapto-2,5,7,10,12,15-hexathiahexadecane, 8-[bis(mercaptomethylthio)methyl]-3, 4,12,13-tetrakis(mercaptomethylthio)-1,15-dimercapto-2,5, 7,9,11,14-hexathiapentadecane, 4,6-bis[3,5-bis (mercaptomethylthio)-7-mercapto-2,6-dithiaheptylthio]-1, 3-dithiane, 4-[3,5-bis(mercaptomethylthio)-7-mercapto-2,6-dithiaheptylthio]-6-mercaptomethylthio-1,3-dithiane, 1,1-bis[4-(6-mercaptomethylthio)-1,3-dithianylthio]-1,3-bis (mercaptomethylthio)propane, 1-[4-(6-mercaptomethylthio)-1,3-dithianylthio]-3-[2,2-bis (mercaptomethylthio)ethyl]-7,9-bis(mercaptomethylthio)-2, 4,6,10-tetrathiaundecane, 3-[2-(1,3-dithietanyl)]methyl-7,9-bis(mercaptomethylthio)-1,11-dimercapto-2,4,6,10-tetrathiaundecane, 9-[2-(1,3-dithietanyl)]methyl-3,5,13,15-tetrakis(mercaptomethylthio)-1,17-dimercapto-2,6,8,10,12, 16-hexathiaheptadecane, and 3-[2-(1,3-dithietanyl)]methyl-7,9,13,15-tetrakis(mercaptomethylthio)-1,17-dimercapto-2, 4,6,10,12,16-hexathiaheptadecane; polythiol compounds having a cyclic structure such as 4,6-bis[4-(6-mercaptomethylthio)-1,3-dithianylthio]-6-[4-(6-mercaptomethylthio)-1,3-dithianylthio]-1,3-dithiane, 4-[3,4,8,9-tetrakis(mercaptomethylthio)-11-mercapto-2,5,7,10-tetrathiaundecyl]-5-mercaptomethylthio-1,3-dithiolane, 4,5-bis[3,4-bis (mercaptomethylthio)-6-mercapto-2,5-dithiahexylthio]-1,3-dithiolane, 4-[3,4-bis(mercaptomethylthio)-6-mercapto-2,5-dithiahexylthio]-5-mercaptomethylthio-1,3-dithiolane, 4-[3-bis(mercaptomethylthio)methyl-5,6-bis (mercaptomethylthio)-8-mercapto-2,4,7-trithiaoctyl]-5-mercaptomethylthio-1,3-dithiolane, 2-{bis[3,4-bis (mercaptomethylthio)-6-mercapto-2,5-dithiahexylthio] methyl}-1,3-dithiethane, 2-[3,4-bis(mercaptomethylthio)-6-mercapto-2,5-dithiahexylthio]mercaptomethylthiomethyl-1, 3-dithiethane, 2-[3,4,8,9-tetrakis(mercaptomethylthio)-11-mercapto-2,5,7,10-tetrathiaundecylthio] mercaptomethylthiomethyl-1,3-dithiethane, 2-[3-bis (mercaptomethylthio)methyl-5,6-bis(mercaptomethylthio)-8-mercapto-2,4,7-trithiaoctyl]mercaptomethylthiomethyl-1, 3-dithiethane, and 4-{1-[2-(1,3-dithietanyl)]-3-mercapto-2-thiapropylthio}-5-[1,2-bis(mercaptomethylthio)-4-mercapto-3-thiabutylthio]-1,3-dithiolane.

<Constituent Ratio of Resin Composition>

The ratio of the curing catalyst in the resin composition is not particularly limited. However, when the resin composition is an epoxy homopolymerization system containing no curing agent, the ratio of the curing catalyst to the epoxy resin in the resin composition is preferably 0.1 to 50 wt %, more preferably 0.1 to 30 wt %, and further preferably 0.1 to 20 wt %. When the resin composition contains the curing agent, this ratio to the epoxy resin in the resin composition is preferably 0.01 to 10 wt %, more preferably 0.01 to 5 wt %, and further preferably 0.01 to 1 wt/o.

<Other Ingredients of Resin Composition>

The curable composition of the present disclosure may contain, other than the base resin, curing catalyst, and curing agent, for example, the below-described ingredients as necessary.

Stabilizer

The resin composition of the present disclosure may be added with a stabilizer for improving storage stability and lengthening pot life. Known various stabilizers can be used as a stabilizer for a one-component type adhesive agent that contains epoxy resin as the base resin. This stabilizer is preferably at least one selected from the group consisting of a liquid boric acid ester compound, aluminum chelate, and organic acid.

Examples of the liquid boric acid ester compound include 2,2'-oxybis(5,5'-dimethyl-1,3,2-oxaborinane), trimethyl borate, triethyl borate, tri-n propyl borate, triisopropyl borate, tri-n-butyl borate, tripentyl borate, triallyl borate, trihexyl borate, tricyclohexyl borate, trioctyl borate, trinonyl borate, tridecyl borate, tridodecyl borate, trihexadecyl borate, trioctadecyl borate, tris(2-ethylhexyloxy)borane, bis (1,4,7,10-tetraoxaundecyl)(1,4,7,10,13-pentaoxatetradecyl) (1,4,7-trioxaundecyl)borane, tribenzyl borate, triphenyl borate, tri-o-tolyl borate, tri-m-tolyl borate, and triethanolamine borate. The liquid boric acid ester compound is preferable, because it is liquid at normal temperature (25° C.) and therefore can reduce the viscosity of the formulation.

An example of the aluminum chelate to be used is aluminum chelate A (manufactured by Kawaken Fine Chemicals Co., Ltd.). An example of the organic acid to be used is barbituric acid.

Filler

The resin composition of the present disclosure can be added with a filler.

Specific examples of the filler include a silica filler, a glass filler, an alumina filler, a titanium oxide filler, a boron nitride filler, an aluminum nitride filler, a talc filler, a calcium carbonate filler, a resin filler (for example, a polytetrafluoroethylene (PTFE) filler and a silicone rubber filler), and an electrically conductive filler such as silver, copper, and nickel. The shape is not particularly limited and may be hollow, spherical, or indefinite. Also, the filler may be surface treated.

Coupling Agent

The resin composition of the present disclosure can be added with a coupling agent. The coupling agent is preferably a silane coupling agent, and various silane coupling agents based on epoxy, amino, vinyl, methacryl, acryl, mercapto, and others can be used. Specific examples of the silane coupling agent include 3-glycidoxypropyltrimethoxysilane, 3-aminopropyltrimethoxysilane, vinyltrimethoxysilane, 3-triethoxysilyl-N-(1,3-dimethyl-butylidene)propylamine, 2-(3,4-epoxycyclohexyl)ethyltrimethoxysilane, p-styryltrimethoxysilane, 3-methacryloxypropylmethyltrimethoxysilane, 3-acryloxypropyltrimethoxysilane, 8-glycidoxyoctyltrimethoxysilane, 3-ureidepropyltriethoxysilane, 3-mercaptopropyltrimethoxysilane, bis (triethoxysilylpropyl)tetrasulfide, and 3-isocyanatepropyltriethoxysilane. These silane coupling agents may be used individually or in combination of two or more.

Other Additive Agents

The resin composition of the present disclosure may be added with other additive agents within the range that does not impair the object of the present invention. Examples thereof include carbon black, titanium black, an ion trapping agent, a levelling agent, an antioxidant, a defoamer, a thixotropic agent, a viscosity modifier, a flame retardant, a colorant, and a solvent. The type and added amount of each additive agent are those known in the art.

==Utilization Method of Resin Composition=

Examples of the resin composition disclosed herein as a one-component epoxy resin include a sealing material and a filling material for electronic components, a dam material, an electrically conductive or insulating adhesive agent, a die attach material, a film, a coating agent, and a shielding material. This resin composition can also be used in a paint, composite materials such as a pipe material and a tank material, civil engineering and construction materials such as a floor material and a membrane, and an adhesive agent. However, the utilization method is not limited thereto. In particular, the resin composition containing the curing catalyst of the present disclosure is suitable for uses of electronic components which are required to have high moisture resistance reliability.

EXAMPLES

Synthesis Method of Compound

Synthesis of (Compound 1) 1-[([1,1'-biphenyl]-2-yl) oxy]-3-(2-methyl-1H-imidazole-1-yl)propan-2-ol

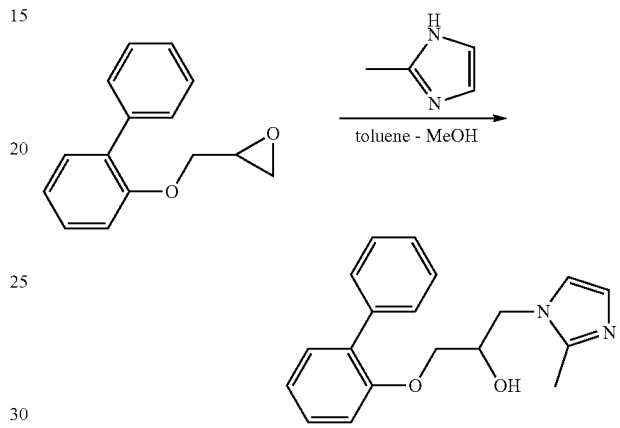

A solution obtained by dissolving 2-methyl-1-H-imidazole (manufactured by Shikoku Chemicals Corporation, 150 g, 1.83 mol) in a mixed solvent of toluene (443 mL) and methanol (121 mL) at room temperature was heated to 80° C. and refluxed while stirring. To the resultant solution, a solution obtained by dissolving 2-{[([1,1'-biphenyl]-2-yl) oxy]methyl}oxirane (manufactured by Sanko Co., Ltd., 210 g, 0.913 mol, epoxy equivalent weight: 230 g/eq) in toluene (363 mL) at room temperature was added at a drop rate of 3.75 mL/min. After the total amount was dropped, the obtained mixture was stirred at 80° C. for 75 minutes. Thereafter, the solvent was distilled away from the obtained reaction product at 50° C. using an evaporator to obtain a crude product (392 g).

The obtained crude product (380 g) was added to methanol (1514 mL), heated to 50° C., and dissolved while stirring. Thereafter, concentration was performed until the total amount of methanol reached 1226 mL, and suction filtration was further performed. The obtained solution was heated to 50° C. again and then left to stand for 16 hours while stirring at room temperature. After the obtained suspension liquid was suction filtered, the residue was washed with pure water (600 mL×4 times). The resultant residue was dried by an oven at 40° C. for 178 hours to obtain 1-[([1,1'-biphenyl]-2-yl)oxy]-3-(2-methyl-1H-imidazole-1-yl)propan-2-ol (134 g, yield: 60%) as a white solid. Measured values for physical properties of the product are as follows.

1-[([1,1'-biphenyl]-2-yl)oxy]-3-(2-methyl-1H-imidazole-1-yl)propan-2-ol $^1$H NMR (400 MHz, METHANOL-$d_4$) δ ppm 2.15 (s, 3H) 3.80-3.90 (m, 2H) 3.95-4.07 (m, 3H) 6.73 (d, 1H) 6.81 (d, 1H) 7.02-7.07 (m, 2H) 7.28-7.34 (m, 3H) 7.41 (t, 2H) 7.50-7.54 (d, 2H).

HRMS (ESI) calcd for C19H20N2O2 [M+H]+ Exact Mass: 309.153, found 309.159.

Synthesis of (Compound 2) 1-[([1,1'-biphenyl]-3-yl)oxy]-3-(2-methyl-1H-imidazole-1-yl)propan-2-ol

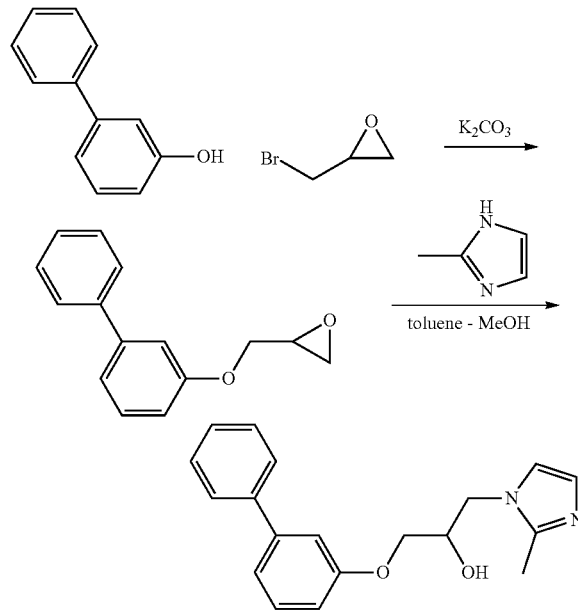

First, 3-phenylphenol (manufactured by Tokyo Chemical Industry Co., Ltd., 33.7 g, 198 mmol) and potassium carbonate (manufactured by Tokyo Chemical Industry Co., Ltd., 35.5 g, 257 mmol) were added to epibromohydrin (manufactured by Tokyo Chemical Industry Co., Ltd., 48.7 mL, 593 mmol). The mixture wad heated to 120° C. and stirred for 4.5 hours. The obtained solution was cooled to room temperature and added with dichloromethane (300 mL), and the solid was filtered out. A liquid obtained by washing this solid with dichloromethane was mixed to the filtrate, and the solvent was distilled away under reduced pressure. The obtained solid was dissolved in dichloromethane (200 mL) and added with silica gel (150 g). The mixture was concentrated under reduced pressure. The obtained solution was purified by medium pressure column chromatography (silica gel 200 g, n-hexane/chloromethane=50/50 to 35/65), and a fraction containing an object substance was recovered and concentrated to obtain 2-{[([1,1'-biphenyl]-3-yl)oxy]methyl}oxirane (37.0 g, 164 mmol) as a colorless oily matter.

Next, 2-methyl-1H-imidazole (manufactured by Shikoku Chemicals Corporation, 40.3 g, 491 mmol) was dissolved in a mixed solvent of toluene (130 mL) and methanol (30 mL). The obtained solution was heated to 80° C. Furthermore, to the resultant solution, a toluene (230 mL) solution of 2-[([1,1'-biphenyl]-3-yl)oxy]methyl)oxirane (37.0 g, 164 mmol) was dropped over 2 hours. Thereafter, the product was stirred at 80° C. for 4 hours. The obtained solution was cooled to room temperature and concentrated under reduced pressure to obtain a solid. The solid was suspended in methanol (50 mL) and dissolved by increasing in temperature to 60° C. Then, the resultant product was added with pure water (100 mL) and thereafter cooled to room temperature. As a result, this was separated into two layers. Furthermore, the product was stirred under ice bath. The precipitated solid was filtered off, washed with pure water, and dried under reduced pressure. The obtained solid was suspended in methanol (150 mL) and dissolved by heating to 60° C. Thereafter, the product was cooled to room temperature. The precipitated solid was filtered off, washed with pure water, and dried under reduced pressure to obtain 1-[([1,1'-biphenyl]-3-yl)oxy]-3-(2-methyl-1H-imidazole-1-yl)propan-2-ol (27.8 g, yield: 55%) as a colorless solid. Measured values for physical properties of the product are as follows.

1-[([1,1'-biphenyl]-3-yl)oxy]-3-(2-methyl-1H-imidazole-1-yl)propan-2-ol $^1$H NMR (400 MHz, METHANOL-$d_4$) S ppm 2.37 (s, 3H) 3.95-3.99 (m, 2H) 4.08-4.12 (m, 1H) 4.18-4.24 (m, 2H) 6.79-6.80 (m, 1H) 6.92 (dd, 1H) 7.02-7.03 (m, 1H) 7.16-7.21 (m, 2H) 7.29-7.36 (m, 2H) 7.41 (t, 2H) 7.58 (d, 2H).

HRMS (ESI) calcd for C19H20N2O2 [M+H]+ Exact Mass: 309.160, found 309.159.

Synthesis of (Compound 3) 1-[([1,1'-biphenyl]-4-yl)oxy]-3-(2-methyl-1H-imidazole-1-yl)propan-2-ol

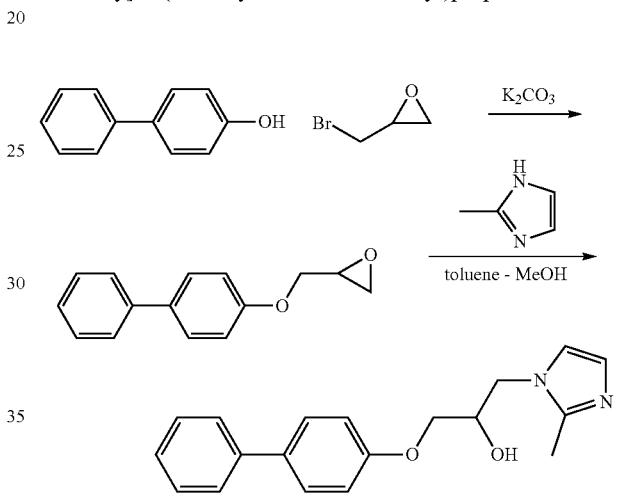

First, 4-phenylphenol (manufactured by Tokyo Chemical Industry Co., Ltd., 5.00 g, 29.4 mmol) and potassium carbonate (manufactured by Tokyo Chemical Industry Co., Ltd., 5.28 g, 38.2 mmol) were added to epibromohydrin (manufactured by Tokyo Chemical Industry Co., Ltd., 7.23 mL, 88.1 mmol). The mixture was heated to 120° C. and stirred for 3 hours. The obtained solution was cooled to room temperature and thereafter added with dichloromethane (30 mL), and the solid was filtered out. A wash liquid obtained by washing this solid with dichloromethane was mixed to the filtrate. The obtained solution was concentrated under reduced pressure. The obtained solid was purified by medium pressure column chromatography (silica gel 100 g, n-hexane/dichloromethane=50/50 to 35/65), and a fraction containing an object substance was recovered and concentrated to obtain 2-{[([1,1'-biphenyl]-4-yl)oxy]methyl}oxirane (5.49 g, 24.3 mmol) as a colorless solid.

Next, 2-methyl-1H-imidazole (manufactured by Tokyo Chemical Industry Co., Ltd., 3.98 g, 48.5 mmol) was dissolved in a mixed solvent of toluene (8 mL) and methanol (4 mL). The solution was heated to 80° C. Thereafter, to the resultant solution, a toluene (35 mL) solution of 2-{[([1,1'-biphenyl]-4-yl)oxy]methyl}oxirane (5.49 g, 24.3 mmol) was dropped over 1 hour. Thereafter, the product was stirred at 80° C. for 3.5 hours. The obtained solution was cooled to room temperature and thereafter concentrated under reduced pressure. The obtained solid was suspended in methanol (15 mL), and the solid was filtered out. A liquid obtained by washing this solid with methanol was mixed to the filtrate. The obtained solution was concentrated under reduced pressure. The obtained solid was purified by medium pressure column chromatography (silica gel 100 g, dichloromethane/methanol=98/2 to 90/10), and a fraction containing an object substance was recovered and concentrated to obtain 1-[([1,1'-biphenyl]-4-yl)oxy]-3-(2-methyl-1H-imidazole-1-yl)propan-2-ol (4.53 g, 14.7 mmol, yield: 61%) as a colorless solid. Measured values for physical properties of the product are as follows.

1-[([1,1'-biphenyl]-4-yl)oxy]-3-(2-methyl-1H-imidazole-1-yl)propan-2-ol $^1$H NMR (400 MHz, METHANOL-$d_4$) δ ppm 2.37 (s, 3H) 3.91-3.99 (m, 2H) 4.08-4.12 (m, 1H) 4.16-4.24 (m, 2H) 6.80 (d, 1H) 7.00-7.04 (m, 3H) 7.26 (t, 1H) 7.38 (t, 2H) 7.51-7.56 (m, 4H).
HRMS (ESI) calcd for C19H20N2O2 [M+H]+ Exact Mass: 309.160, found 309.159.

Synthesis of (Compound 4) 1-[([1,1'-biphenyl]-2-yl)oxy]-3-(2-undecyl-1H-imidazol-1-yl)propan-2-ol

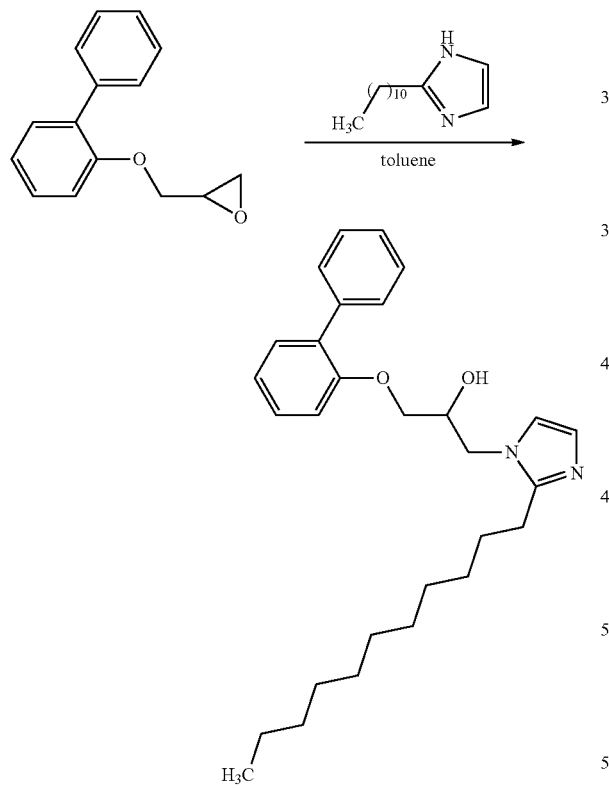

To toluene (64 mL), 2-undecyl-1H-imidazole (manufactured by Shikoku Chemicals Corporation, 53.07 g, 239 mmol) was added. The solution was heated to 80° C. Thereafter, to the resultant solution, a toluene (190 mL) solution of 2-{[([1,1'-biphenyl]-2-yl)oxy]methyl}oxirane (manufactured by Sanko Co., Ltd., 30.0 g, 133 mmol) was dropped over 4.5 hours. Thereafter, the product was stirred at the same temperature for 4 hours. The reaction solution was cooled to room temperature and thereafter concentrated under reduced pressure to obtain a residue (84.4 g). The obtained residue (67.1 g) was purified by medium pressure column chromatography (silica gel, dichloromethane/methanol=99/1 to 90/10), and a fraction containing an object substance was concentrated to obtain 1-[([1,1'-biphenyl]-2-yl)oxy]-3-(2-undecyl-1H-imidazole-1-yl)propan-2-ol (35.6 g) as a colorless solid. To the obtained 1-[([1,1'-biphenyl]-2-yl)oxy]-3-(2-undecyl-1H-imidazole-1-yl)propan-2-ol (35.6 g), acetonitrile (200 mL) was added. The mixture was subjected to ultrasonic waves for 30 minutes by ultrasonic cleaning, filtered, and washed with acetonitrile (10 mL×5). The solid was dried under reduced pressure to obtain 1-[([1,1'-biphenyl]-2-yl)oxy]-3-(2-undecyl-1H-imidazole-1-yl)propan-2-ol (30.8 g, 68.7 mmol, yield: 65%) as a colorless solid. Measured values for physical properties of the product are as follows.

1-[([1,1'-biphenyl]-2-yl)oxy]-3-(2-undecyl-1H-imidazole-1-yl)propan-2-ol $^1$H NMR (400 MHz, METHANOL-$d_4$) δ ppm 0.87 (t, 3H) 1.15-1.30 (m, 16H) 1.51-1.55 (m, 2H) 2.46 (t, 2H) 3.83-3.89 (m, 2H) 3.94-4.00 (m, 2H) 4.02-4.04 (m, 1H) 6.76 (d, 1H) 6.84 (s, 1H) 7.01-7.05 (m, 2H) 7.27-7.32 (m, 3H) 7.40 (t, 2H) 7.53 (d, 2H). HRMS (ESI) calcd for C29H40N2O2 [M+H]+ Exact Mass: 449.316, found 449.316.

Synthesis of (Compound 5) 1-(2-methyl-1H-imidazole-1-yl)-3-phenoxypropan-2-ol

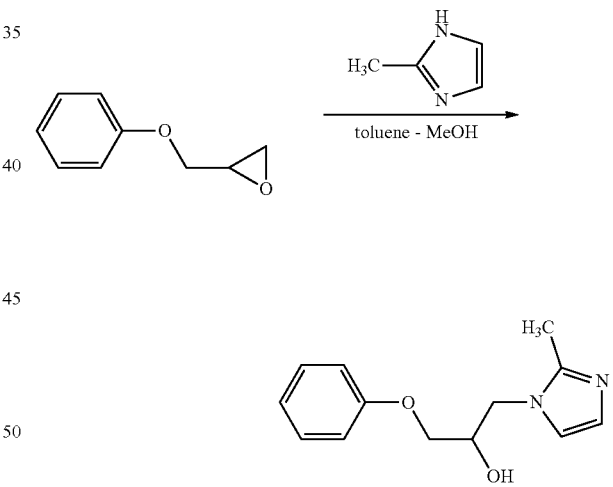

In a mixed solvent of toluene (78.7 mL) and methanol (17.7 mL), 2-methyl-1H-imidazole (manufactured by Shikoku Chemicals Corporation, 21.8 g, 266 mmol) was dissolved. The solution was heated to 80° C. To this solution, a toluene (38.1 mL) solution of 2-(phenoxymethyl)oxirane (manufactured by Nagase ChemteX Corporation, 22.0 g, 147 mmol) was dropped over 1 hour. Thereafter, the product was stirred at the same temperature for 1 hour. The obtained solution was cooled to room temperature, and the solvent was distilled away under reduced pressure to obtain 1-(2-methyl-1H-imidazole-1-yl)-3-phenoxypropan-2-ol (47.85 g) as a yellow solid. The product was identified by $^1$HNMR to confirm that an object substance was obtained.

Synthesis of (Compound 6) α,α'-[(1-methylethyl-idene)bis(4,1-phenyleneoxymethylene)]bis[2-methyl-1H-imidazole-1-ethanol

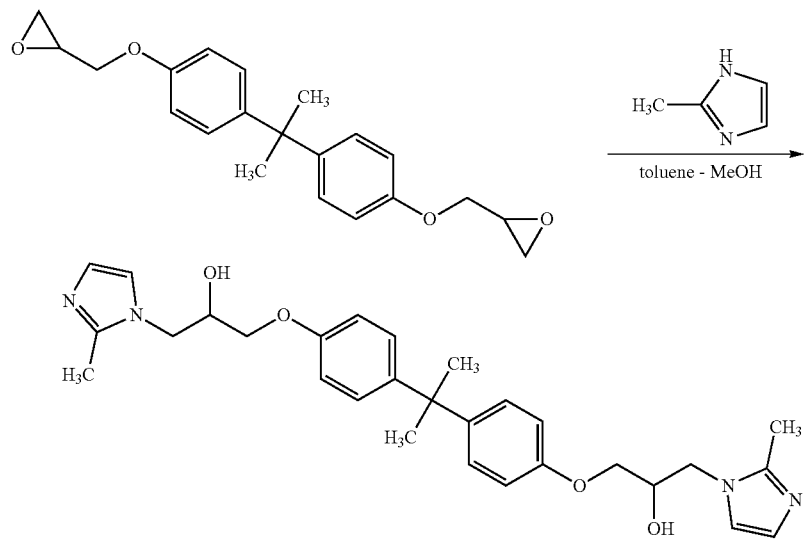

In a mixed solvent of toluene (60.6 mL) and methanol (16.8 mL), 2-methyl-1H-imidazole (manufactured by Shikoku Chemicals Corporation, 43.8 g, 533 mmol) was dissolved. The solution was heated to 80° C. Furthermore, to this solution, a toluene (83.2 mL) solution of 2,2'-1{propane-2,2-diylbis[(4,1-phenylene)oxymethylene]}bis(oxirane) (manufactured by Osaka Soda Co., Ltd., 48.0 g, 133 mmol) was dropped over 2 hours. Thereafter, the product was stirred at 80° C. for 2 hours. The obtained solution was cooled to room temperature, and the solvent was distilled away under reduced pressure to obtain α,α'-[(1-methylethylidene)bis(4,1-phenyleneoxymethylene)]bis[2-methyl-1H-imidazole-1-ethanol (112.9 g) as a yellow solid. The product was identified by $^1$HNMR to confirm that an object substance was obtained.

==Characteristics I of Resin Composition==

In the present example, it is demonstrated that the resin composition containing the curing catalyst described herein has excellent characteristics.

Figure 2:
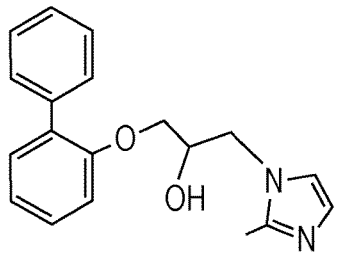
FIG. 2 is a diagram illustrating structural formulae of compounds used as a curing catalyst in Examples.
Figure 2:
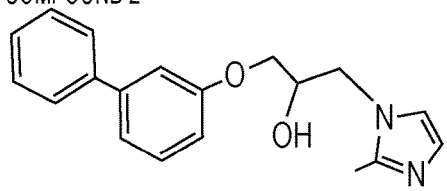
Figure 2:
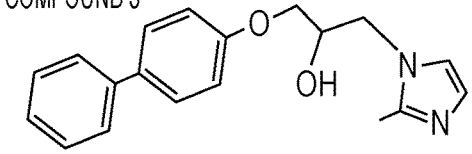
Figure 2:
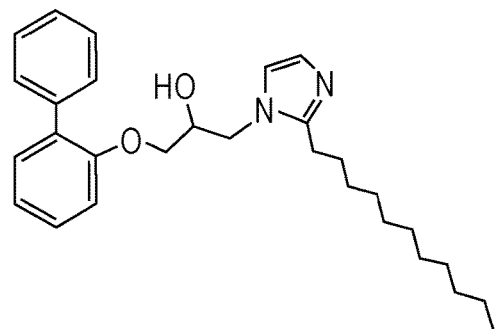
Figure 2:
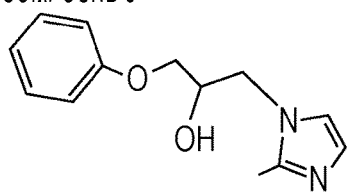
Figure 2:
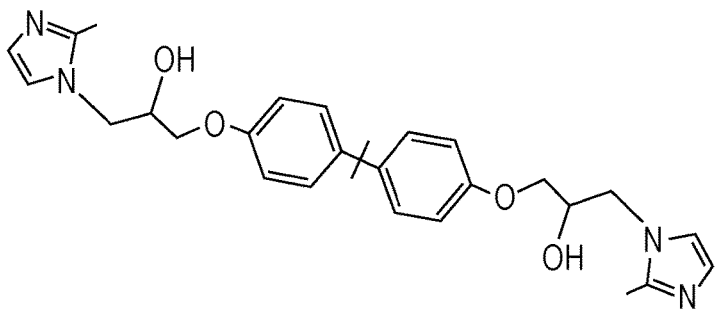

First, compounds 1 to 6 illustrated in Table 1 were prepared as a curing catalyst. The structural formulas of the compounds are illustrated in FIG. 2. Synthesis methods of compounds 1 to 6 are as described above. The melting point (melting peak temperature) of the epoxy imidazole adduct was calculated by the following procedure, using a differential scanning calorimeter (DSC 204 F1 Phoenix (registered trademark)) (manufactured by NETZSCH). First, 5 mg of each resin composition was weighed into an aluminum pan, and the aluminum pan was sealed with an aluminum lid. Thereafter, the center of this lid was punched with a needle to prepare a measurement sample. Next, this measurement sample was measured for a heat flow (mW/mg) while increasing in temperature under the conditions of nitrogen atmosphere (100 mL/min), a temperature ranging from 25° C. to 250° C., and a temperature increasing rate of 10° C./min. A temperature at which a peak top is obtained on the graph was calculated by an analysis software (NETZSCH Proteus-Thermal Analysis Version 6.1.0 B). This temperature was defined as a melting peak temperature. In compounds 1 to 4 (solid matter), a clear melting peak was obtained. However, in compound 5 (oily) and compound 6 (solid matter), a clear melting peak was not obtained.

TABLE 1

| Compound | Epoxy resin | Imidazole | Melting peak temperature (° C.) |
| --- | --- | --- | --- |
| 1 | o-Phenylphenol glycidyl ether | 2-Methyl imidazole | 160 |
| 2 | m-Phenylphenol glycidyl ether | 2-Methyl imidazole | 134 |
| 3 | p-Phenylphenol glycidyl ether | 2-Methyl imidazole | 173 |
| 4 | o-Phenylphenol glycidyl ether | 2-Undecyl imidazole | 88 |
| 5 | Phenyl glycidyl ether | 2-Methyl imidazole | None |
| 6 | Bisphenol A type epoxy resin | 2-Methyl imidazole | None |

Compounds 1 to 6 or 2-methyl imidazole (2MZ) (each being the curing catalyst) were each ground in a mortar and thereafter poured in EXA835LV (manufactured by DIC Corporation, mixture of bisphenol A type epoxy resin and bisphenol F type epoxy resin) as an epoxy resin while stirring by hand. It is noted that the ratios thereof were 12 wt % for the curing catalyst and 88 wt % for the epoxy resin. These were blended to some extent by stirring and thereafter ground in a mortar until aggregates disappeared. The product was stirred and defoamed under vacuum using a planetary stirring and defoaming apparatus to obtain a resin composition.

When prepared and after stored for 24 hours under the environment of 25° C.±2° C. and 50% RH±10% RH, the resin composition was measured using an E type viscometer (TVE 25H: manufactured by Toki Sangyo Co., Ltd, rotor name: 3°×R9.7) at 5 rpm and 25° C. in a previously set appropriate range (H, R, or U). The pot life was calculated according to (viscosity after 24 hours/viscosity when prepared). The peak temperature during reaction was measured using a differential scanning calorimeter (DSC 204 F1 Phoenix (registered trademark)) (manufactured by NETZSCH). First, 5 mg of each resin composition was weighed into an aluminum pan, and the aluminum pan was sealed with an aluminum lid. Thereafter, the center of this lid was punched with a needle to prepare a measurement sample. Next, this measurement sample was measured for a heat flow (mW/mg) while increasing in temperature under the conditions of nitrogen atmosphere (100 mL/min), a temperature ranging from 25 to 250° C., and a rate of 10° C./min. A temperature (referred to as a reaction peak top temperature as described herein) at which an exothermic peak is obtained was calculated by an analysis software (NETZSCH Proteus-Thermal Analysis Version 6.1.0 B). The gel time was measured using a gelation tester (GT-D-15A: manufactured by Yukari Giken Co.). A hot plate was set at 120° C., and the resin composition was transferred on the hot plate by a test bar. The gel time was defined as a time until the hardness of the resin composition becomes such that the resin composition does not change in shape even when touched by the test bar.

Also, a Teflon (registered trademark) sheet was stuck on a surface of a 3 mm thick glass plate, and a spacer (obtained by stacking heat-resistant tapes) was disposed at two locations on the Teflon sheet such that the film thickness becomes 300±200 μm when cured. Next, the resin composition was applied between the spacers. The resin composition was sandwiched by another glass plate on which a Teflon (registered trademark) sheet had been stuck, in such a manner as not to catch air bubbles. Then, the resin composition was cured at 150° C. for 30 minutes to obtain a cured product. Finally, this cured product was peeled from the glass plate on which the Teflon (registered trademark) sheet had been stuck, and cut out by a cutter into a prescribed size (30 mm×30 mm) to obtain a test piece. It is noted that the cut end was smoothed with sandpaper, and the weight of this cured product was measured. The test piece was subjected to a PCT (pressure cooker test) (conditions: 121° C., 2 atm, 100% RH, 20 hours) by a highly accelerated life test apparatus (EHS-221M: manufactured by ESPEC Corp.). Thereafter, the weight of the test piece was measured within 15 minutes, and a water absorption rate was calculated according to (((weight after left to stand−weight before left to stand)×100)/weight before left to stand). Also, the surface of the cured product was visually observed and touched for roughness, perforations, elution of ingredients, softening, and deformation to check whether deterioration occurred. Table 2 illustrates the result.

after 24 hours (indicated as UM in the table). In this manner, the resin compositions of Examples had longer pot life. It is noted that for Examples 1 and 4 in which imidazole substitutes at the ortho position of biphenyl, the viscosity after 72 hours was measured. The pot life was 1.2 times in the resin composition of Example 1. However, it was 1.4 times in the resin composition of Example 4.

Also, in Examples 1 to 4, gelation occurred even at 120° C. In Comparative Examples 1 to 3, the pot life was too short to withstand actual use, resulting in failing to measure the gel time.

Tolerance to high temperature, high humidity, and high pressure treatments after curing was higher in the cured products of Examples 1 to 4 than in the cured products of Comparative Examples 1 to 3. Also, the water absorption rate of the cured product was 3.0% or less in all Examples and as particularly excellent as 2.0% or less in Examples 1, 2, and 4. On the other hand, in some of Comparative Examples, the water absorption rate of the cured product exceeded 3.0%.

In this manner, a resin composition having good pot life, sufficient curing properties, and better characteristics in terms of moisture resistance can be obtained with the epoxy amine adduct disclosed herein, compared to a monofunctional phenyl epoxy adduct (Comparative Example 1), a bifunctional epoxy adduct (Comparative Example 2), and a non-adduct (Comparative Example 3).

==Characteristics II of Resin Composition==

In Examples 5 to 7, the resin composition containing compound 1 and an epoxy resin exhibits good characteristics even in combination with another epoxy resin and another curing agent.

As the curing catalyst, compound 1 was used in Examples 5 to 7, and 2-methyl imidazole (2MZ) was used in Comparative Examples 4 to 6. As the epoxy resin, there were used EXA835LV (manufactured by DIC Corporation, mixture of bisphenol A type epoxy resin and bisphenol F type epoxy resin), YDF8170 (manufactured by Nippon Steel Chemical & Material Co., Ltd., bisphenol F type epoxy resin), and CDMDG (manufactured by Showa Denko K.K., aliphatic epoxy resin). These epoxy resins are cured through homopolymerization of epoxy, curing reaction by an acid anhydride, and curing reaction by a phenol-based substance.

TABLE 2

| | | Example/Comparative Examples | | | | | | |
|---|---|---|---|---|---|---|---|---|
| | | Examples | | | | Comparative Examples | | |
| | | 1 | 2 | 3 | 4 | 1 | 2 | 3 |
| | Curing catalyst | Compound 1 | Compound 2 | Compound 3 | Compound 4 | Compound 5 | Compound 6 | 2MZ |
| Evaluation result | Pot life, viscosity change ratio | 1.0 | 1.1 | 1.0 | 1.0 | UM | UM | UM |
| | Reaction peak top temperature (° C.) | 120 | 105 | 114 | 108 | — | — | — |
| | 120° C. Gel time | 1 min and 19 sec | 1 min and 12 sec | 1 min and 40 sec | 3 min and 11 sec | — | — | — |
| Moisture resistance of cured product | Deterioration after PCT | No | No | No | No | Yes | Yes | Yes |
| | Water absorption rate (%) | 1.9 | 1.6 | 3.0 | 1.4 | 2.7 | 1.2 | 3.6 |

UM: Unmeasurable

In Examples 1 to 4 (when compounds 1 to 4 were used), the viscosity hardly changed even after 24 hours of the preparation of the resin composition. However, in Comparative Examples 1 to 3 (when compounds 5 and 6 and 2MZ were used), the viscosity reached too high to be measured It is noted that measurement of pot life, reaction peak top temperature, and gel time, observation of deterioration after a PCT, and calculation of a water absorption rate were performed under the same experiment conditions as in Table 2, except that the temperature for measuring the gel time was increased to 150° C.

TABLE 3

|  |  | Examples | | | Comparative Examples | | |
|---|---|---|---|---|---|---|---|
|  |  | 5 | 6 | 7 | 4 | 5 | 6 |
| Curing catalyst | Compound 1 (wt %) | 12 | 1 | 1 |  |  |  |
|  | 2-Methyl imidazole (wt %) |  |  |  | 12 | 1 | 1 |
| Epoxy resin | EXA835LV (wt %) |  | 4 | 57 |  | 4 | 57 |
|  | YDF8170 (wt %) |  | 38 |  |  | 38 |  |
|  | CDMDG (wt %) | 88 |  |  | 88 |  |  |
| Acid anhydride | YH306 (wt %) |  | 57 |  |  | 57 |  |
| Phenol resin | MEH8005 (wt %) |  |  | 42 |  |  | 42 |
| Evaluation result | Pot life, viscosity change ratio (times) after 24 hr | 1.0 | 1.2 | 1.4 | UM | 2.8 | 14.5 |
|  | Reaction peak top temperature (° C.) | 128 | 157 | 118 | 120 | 140 | 135 |
|  | 150° C. Gel time | 7 min | 2 min | 6 min and 30 sec | 18 sec | 1 min and 3 sec | 1 min and 20 sec |
|  | Moisture resistance of cured product — Deterioration after PCT | No | No | No | Yes | Yes | Yes |
|  | Water absorption rate (%) | 3.9 | 0.8 | 1.7 | 6.6 | 0.8 | 1.9 |

As illustrated in Examples 5 to 7, even when the epoxy resin is aliphatic epoxy resin or even when the curing agent is an acid anhydride or phenolic resin, the epoxy imidazole adduct disclosed herein can have good pot life and achieve sufficient curing. Also, a resin composition having better characteristics in terms of pot life and moisture resistance can be obtained, compared to when 2MZ was used as the curing catalyst.

INDUSTRIAL APPLICABILITY

According to the present invention, a curing catalyst, a resin composition, a sealing material, an adhesive agent, and a cured product, which have good characteristics, can be obtained.

The invention claimed is:

1. A curing catalyst for epoxy resin, comprising an epoxy imidazole adduct having structural formula (I) below:

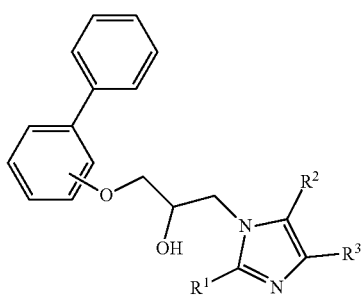

(I)

wherein $R^1$ is a group selected from hydrogen, phenyl, and C1-C17 alkyls, and $R^2$ and $R^3$ are each independently a group selected from hydrogen and C1-C6 alkyls.

2. The curing catalyst for epoxy resin according to claim 1, comprising an epoxy imidazole adduct having structural formula (Io) or (Im) below:

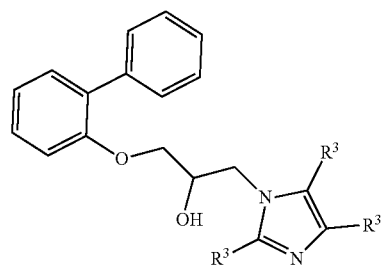

(Io)

wherein $R^1$ is a group selected from hydrogen, phenyl, and C1-C17 alkyls, and $R^2$ and $R^3$ are each independently a group selected from hydrogen and C1-C6 alkyls

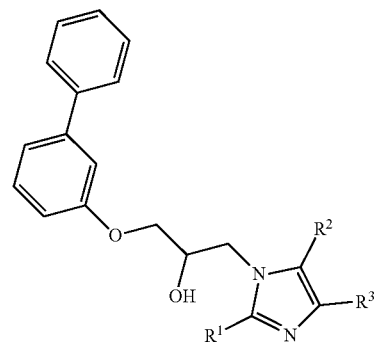

(Im)

wherein $R^1$ is a group selected from hydrogen, phenyl, and C1-C17 alkyls, and $R^2$ and $R^3$ are each independently a group selected from hydrogen and C1-C6 alkyls.

3. The curing catalyst for epoxy resin according to claim 1, wherein $R^1$ is a group selected from the group consisting of hydrogen and C1-C6 alkyls.

4. The curing catalyst for epoxy resin according to claim 1, wherein $R^1$ is a group selected from the group consisting of C8-C17 alkyls.

5. The curing catalyst for epoxy resin according to claim 1, wherein the epoxy imidazole adduct is selected from the group consisting of compounds 1 to 4 below:

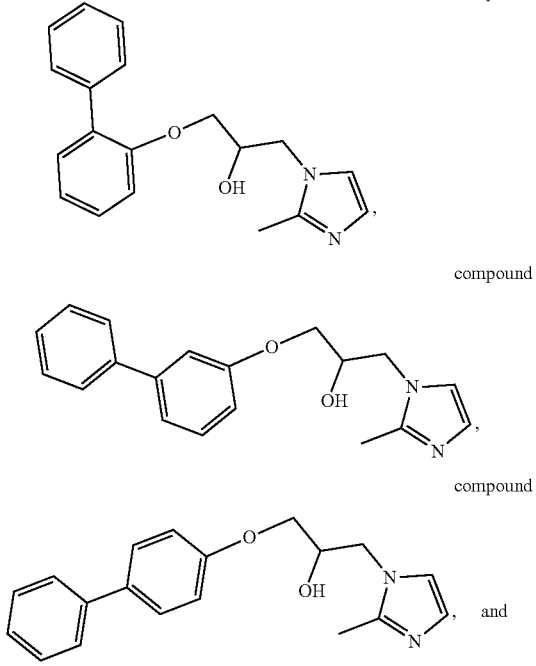

6. A resin composition comprising the curing catalyst according to claim 1 and an epoxy resin.

7. The resin composition according to claim 6, further comprising a curing agent for the epoxy resin.

8. The resin composition according to claim 7, wherein the curing agent is an acid anhydride-based or phenol-based curing agent.

9. A sealing material comprising the resin composition according to claim 6.

10. An adhesive agent comprising the resin composition according to claim 6.

11. A cured product of the resin composition according to claim 6.

* * * * *